(12) United States Patent
Lin et al.

(10) Patent No.: US 6,312,976 B1
(45) Date of Patent: Nov. 6, 2001

(54) METHOD FOR MANUFACTURING LEADLESS SEMICONDUCTOR CHIP PACKAGE

(75) Inventors: Chun Hung Lin; Chun-Chi Lee; Su Tao, all of Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/444,366

(22) Filed: Nov. 22, 1999

(51) Int. Cl.$^7$ .................... H01L 21/44; H01L 21/48; H01L 21/50; H01L 23/495
(52) U.S. Cl. .................... 438/112; 438/111; 438/123; 257/666; 257/667
(58) Field of Search .................... 438/111, 112; 257/666, 667, 702

(56) References Cited

U.S. PATENT DOCUMENTS

| | | |
|---|---|---|
| 5,891,384 | 4/1999 | Miyajima . |
| 5,891,483 | 4/1999 | Miyajima . |
| 6,081,029 * | 2/1999 | Yamaguchi .................... 257/718 |

* cited by examiner

Primary Examiner—Charles Bowers
Assistant Examiner—Nema Berezny

(57) ABSTRACT

A method of manufacturing a leadless semiconductor chip package comprises the steps of: attaching a semiconductor die onto a die pad of a lead frame, wherein the lead frame comprises a plurality of leads arranged about the periphery of the die pad and each lead has a notch formed at the to-be-punched position thereof; wire bonding the inner ends of the leads to bonding pads on the semiconductor die; sucking a film against a lower part of a molding die; closing and clamping the molding die in a manner that the semiconductor die is positioned in a cavity of the molding die and the lead frame is disposed against the film; transferring a hardenable molding compound into the cavity; hardening the molding compound; opening the molding die to take out the molded product; and punching the molded product along the notches of the leads thereby making the singulation process more convenient and correct. The lower surface of each lead of the lead frame according to the present invention is smaller than the upper surface thereof such that each lead has a tapered profile which cooperates with the film to provide better sealing effect thereby preventing the formation of flash.

6 Claims, 5 Drawing Sheets

METHOD FOR MANUFACTURING LEADLESS SEMICONDUCTOR CHIP PACKAGE

BACKGROUND OF THE INVENTION

1. Field of the Invention

This invention generally relates to an electronic device, and more particularly to a leadless semiconductor chip package and a manufacturing method thereof, wherein a semiconductor die is encapsulated by a plastic package body in a manner that the backside surface of the die is exposed through the plastic package body.

2. Description of the Related Art

FIG. 1 depicts a conventional semiconductor chip package including a lead frame for supporting a semiconductor die 100. The lead frame includes a plurality of leads having outer lead portions 106 and inner ends 107. The die 100 is attached onto a die pad 111 by means of a silver paste 114. The die pad 111 is connected to the lead frame by several supporting bars (not shown in FIG. 1). The outer lead portions 106 are used for electrical coupling to an outside circuit. The die 100 has bonding pads 117 electrically interconnected to the inner ends 107 of the lead frame though bonding wires 115. The die 100, the die pad 111, the inner ends 107 of the lead frame and bonding wires 115 are encapsulated in a plastic package body 116 made of insulating material such as epoxy.

Because the plastic package body 116 completely surrounds the die 100, the heat generated from the die 100 during normal operation must pass through the package body 116 to outside. Due to the insulating properties of the package body 116, heat dissipation from the die 100 is resisted, thereby creating, in some instances, high temperatures within the conventional package which might impair or damage the die 100.

Therefore, the semiconductor industry develops a leadless semiconductor chip package 200 (as shown in FIG. 2) mainly comprising a die 210 disposed on a die pad 220 of a lead fame. The lead frame comprises a plurality of leads 230 electrically connected to the die 210 through a plurality of gold wires 240. The die and the lead frame are enclosed in a package body 250 wherein the lower surface of the lead frame is exposed through the package body 250. Consequently, the heat generated from the semiconductor die during normal operation can be directly transferred through the die pad 220 of the lead frame to outside thereby enhancing the thermal performance of the leadless semiconductor chip package 200. However, since the lower surface of the lead frame is exposed through the package body, flash problems tend to occur at the edge 220a of the die pad 220 and the edge 230a of the leads 230, which may be fatal to the solder joint reliability thereof.

SUMMARY OF THE INVENTION

It is a primary object of the present invention to provide a method for manufacturing a leadless semiconductor chip package which utilizes a film to reduce the occurrence of flash during the encapsulation process.

It is a secondary object of the present invention to provide a method for manufacturing a leadless semiconductor chip package which utilizes a tapered lead frame cooperating with a film to further prevent the formation of flash during the encapsulation process.

It is another object of the present invention to provide a method for manufacturing a leadless semiconductor chip package which utilizes a lead frame with notches at the to-be-punched positions thereof to make the singulation process more convenient and correct.

A method of manufacturing a leadless semiconductor chip package in accordance with the present invention comprises the steps of: (A) attaching a semiconductor die onto a die pad of a lead frame, wherein the lead frame comprises a plurality of leads arranged about the periphery of the die pad and each lead has a notch formed at the to-be-punched position thereof; (B) wire bonding the inner ends of the leads to bonding pads on the semiconductor die; (C) sucking a film against a lower part of a molding die, wherein the upper part of the molding die has a cavity; (D) closing and clamping the molding die in a manner that the semiconductor die is positioned in the cavity and the lead frame is disposed against the film; (E) transferring a hardenable molding compound into the cavity; (F) hardening the molding compound; (G) unclamping and opening the molding die to take out the molded product; and (H) punching the molded product in a manner that the punching line is corresponding to the notches of the leads. The lower surface of each lead of the lead frame according to the present invention is smaller than the upper surface thereof such that each lead has a tapered profile.

In the method of manufacturing a leadless semiconductor chip package in accordance with the present invention, the to-be-molded semiconductor die and lead frame is placed on the film sucked against the lower part of the molding die during the encapsulation process. Since the film is made of heat-resistant and elastic material, it provides good sealing such that flash is prevented from forming on the lower surface of the leadless semiconductor chip package, thereby assuring the solder joint solderability. Further, each lead of the lead frame in accordance with the present invention has a tapered profile which cooperates with the film to provide better sealing effect thereby further preventing the formation of flash.

Since the lead frame in accordance with the present invention has notches formed at the to-be-punched positions thereof, the molded product can be punched along the notches of the lead frame thereby making the singulation process more convenient and correct.

DETAILED DESCRIPTION OF THE PREFERRED EMBODIMENT

Figure 1:
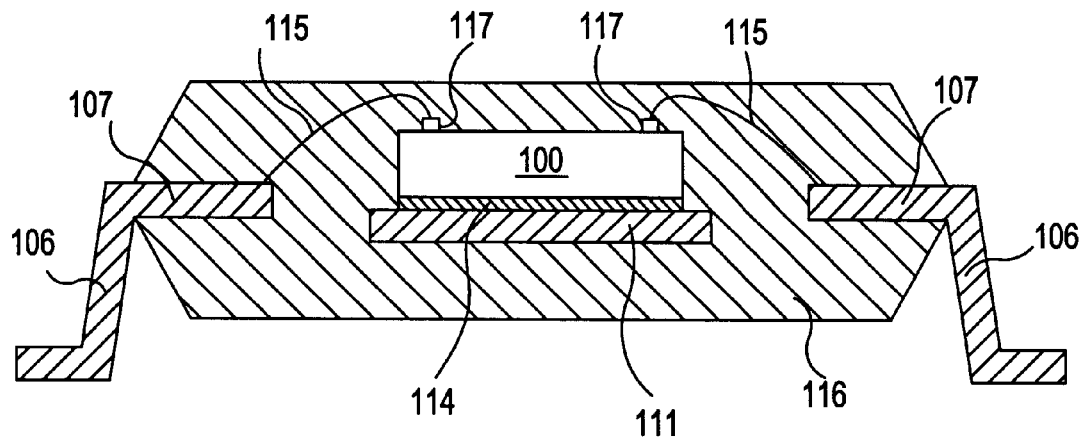
FIG. 1 is a cross sectional view of a conventional semiconductor chip package.
Figure 2:
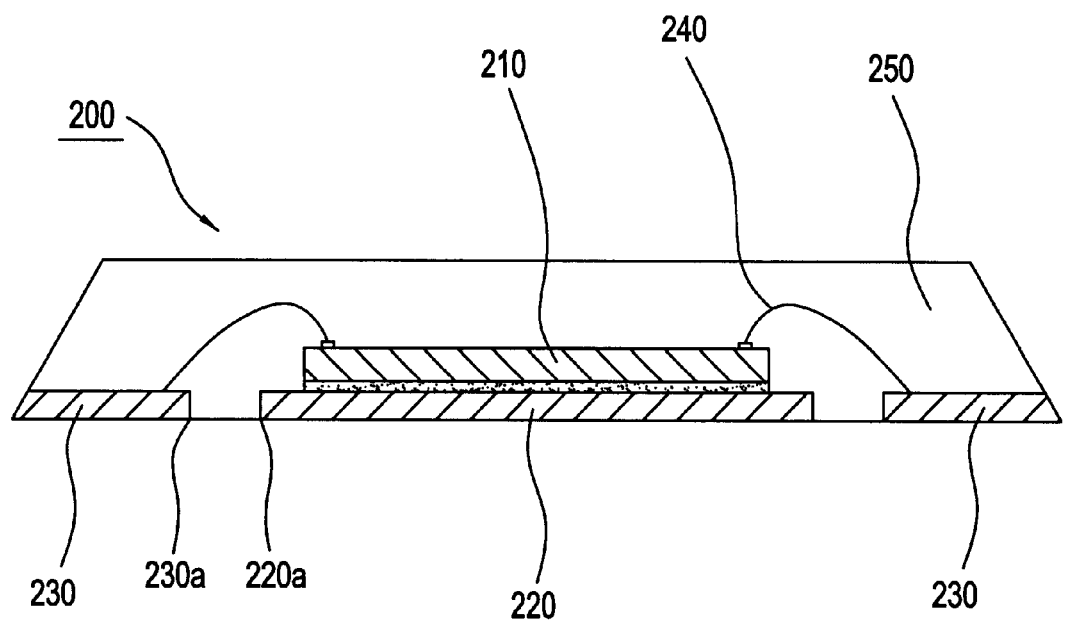
FIG. 2 is a cross sectional view of another conventional semiconductor chip package.
Figure 3:
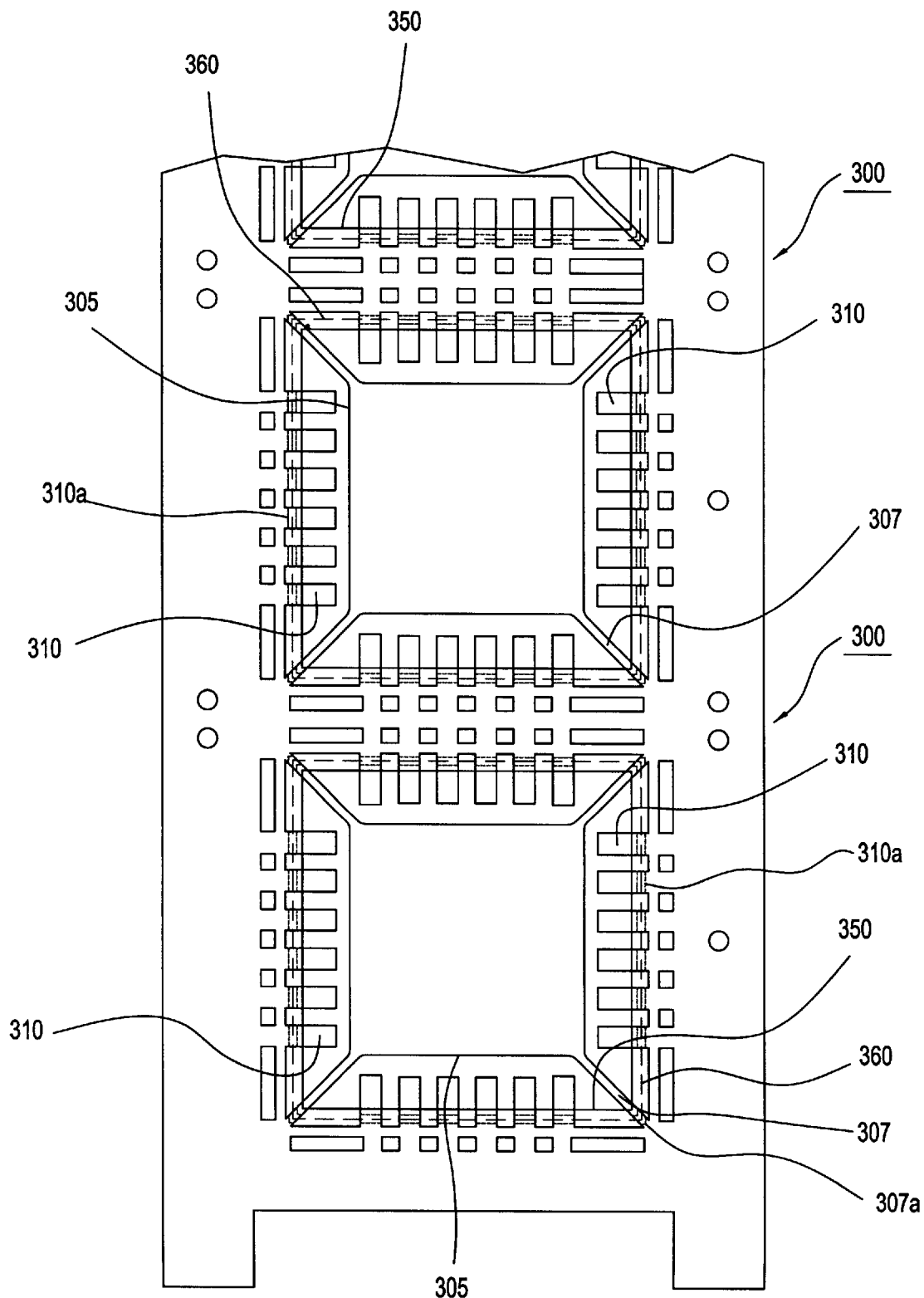
FIG. 3 is a top plan view of a portion of a lead frame employed in the manufacturing of a leadless semiconductor chip package in accordance with the present invention.

FIG. 3 illustrates one part of a lead frame employed in the manufacturing of a leadless semiconductor chip package in accordance with the present invention. The lead frame includes a multiplicity of units generally denoted with the numeral 300. Each unit 300 of the lead frame generally comprises a die pad 305 and a plurality of leads 310 arranged about the periphery of the die pad 305. The die pad 305 is connected to the lead frame by supporting bars 307. Preferably, the lower surface of the die pad 305 is smaller than the upper surface thereof such that the die pad 305 has a tapered profile. The lower surface of each lead 310 is smaller than the upper surface thereof such that each lead 310 has a tapered profile; each lead 310 has a notch 310a formed at the to-be-punched position thereof (see FIG. 4). Preferably, the lower surface of each supporting bar 307 is smaller than the upper surface thereof; and each supporting bar 307 has a notch 307 formed at the to-be-punched position thereof.

The lead frame in accordance with the present invention is formed from a thin metal strip which has been etched or stamped to form a pattern similar to that shown in FIG. 3. Preferably, the lead frame is made of copper or alloys containing copper. Alternatively, the lead frame is made of iron, nickel or alloys thereof, and then plated with copper. The notch 310a, 307a is preferably formed at the lower surfaces of leads 310 and supporting bars 307 by etching or stamping.

Figure 5:
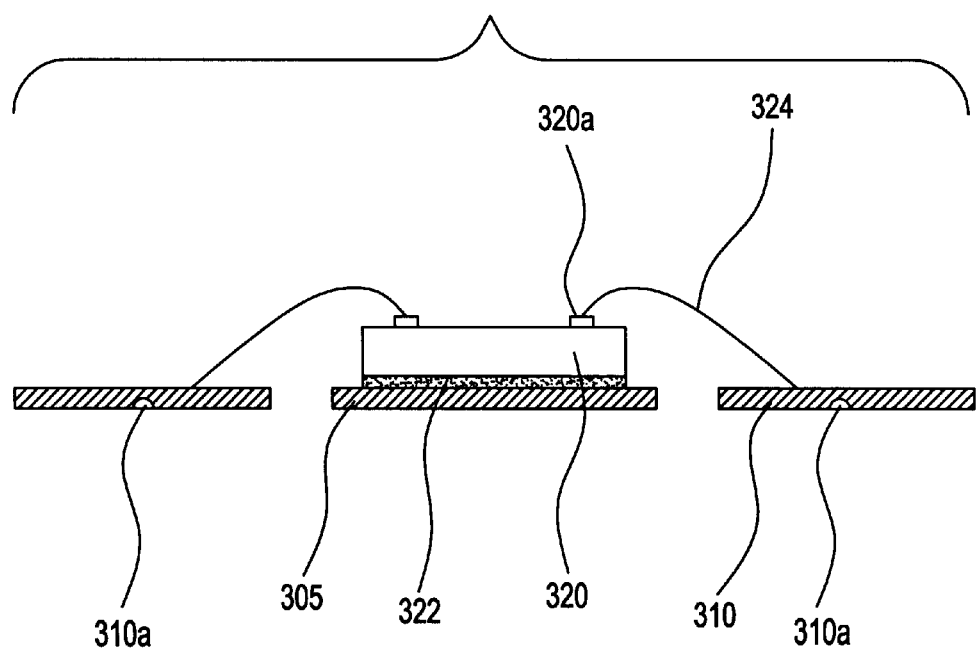
FIGS. 5–7 illustrate a method for producing a leadless semiconductor chip package in accordance with the present invention.
Figure 6:
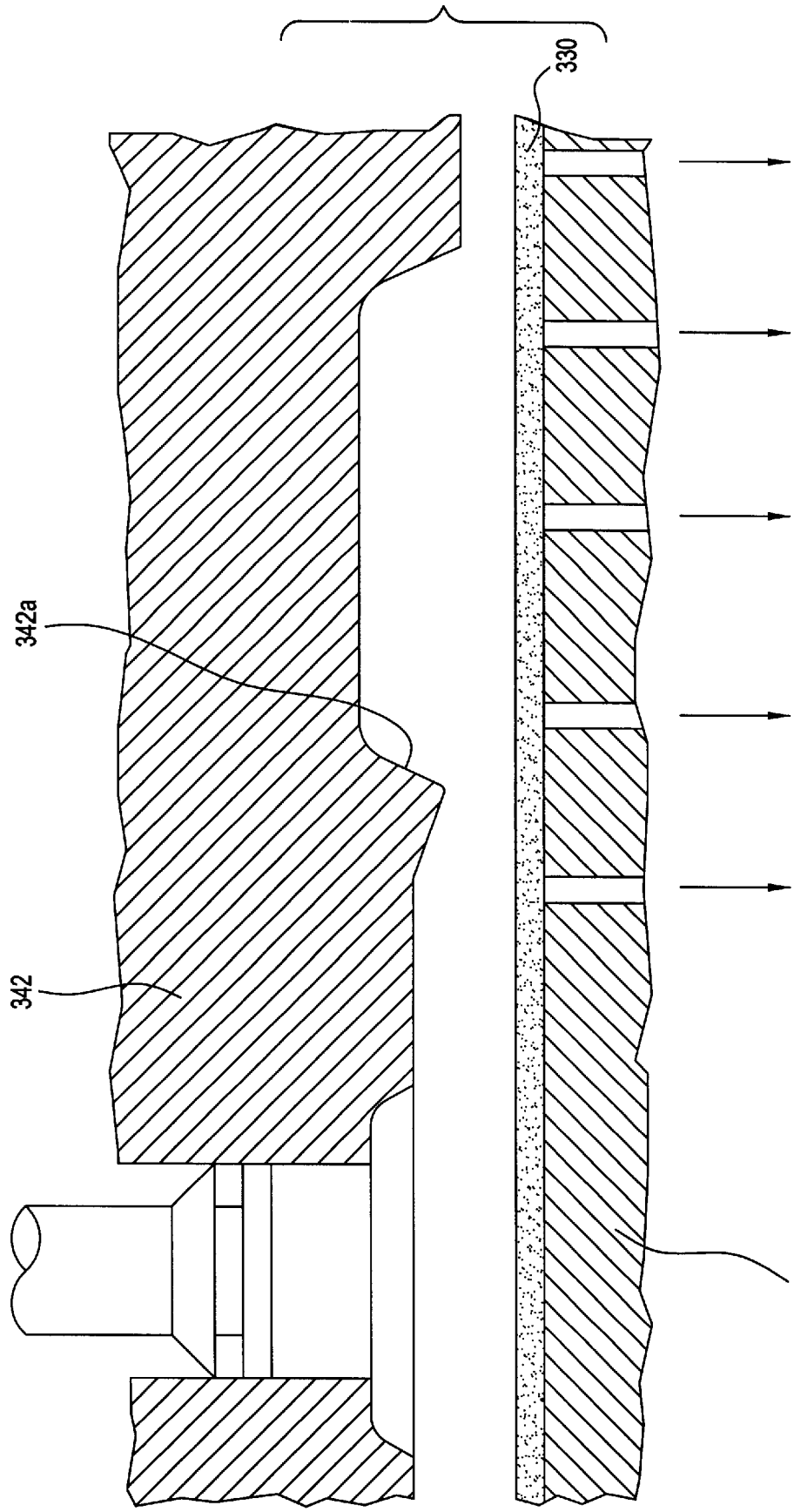
Figure 7:
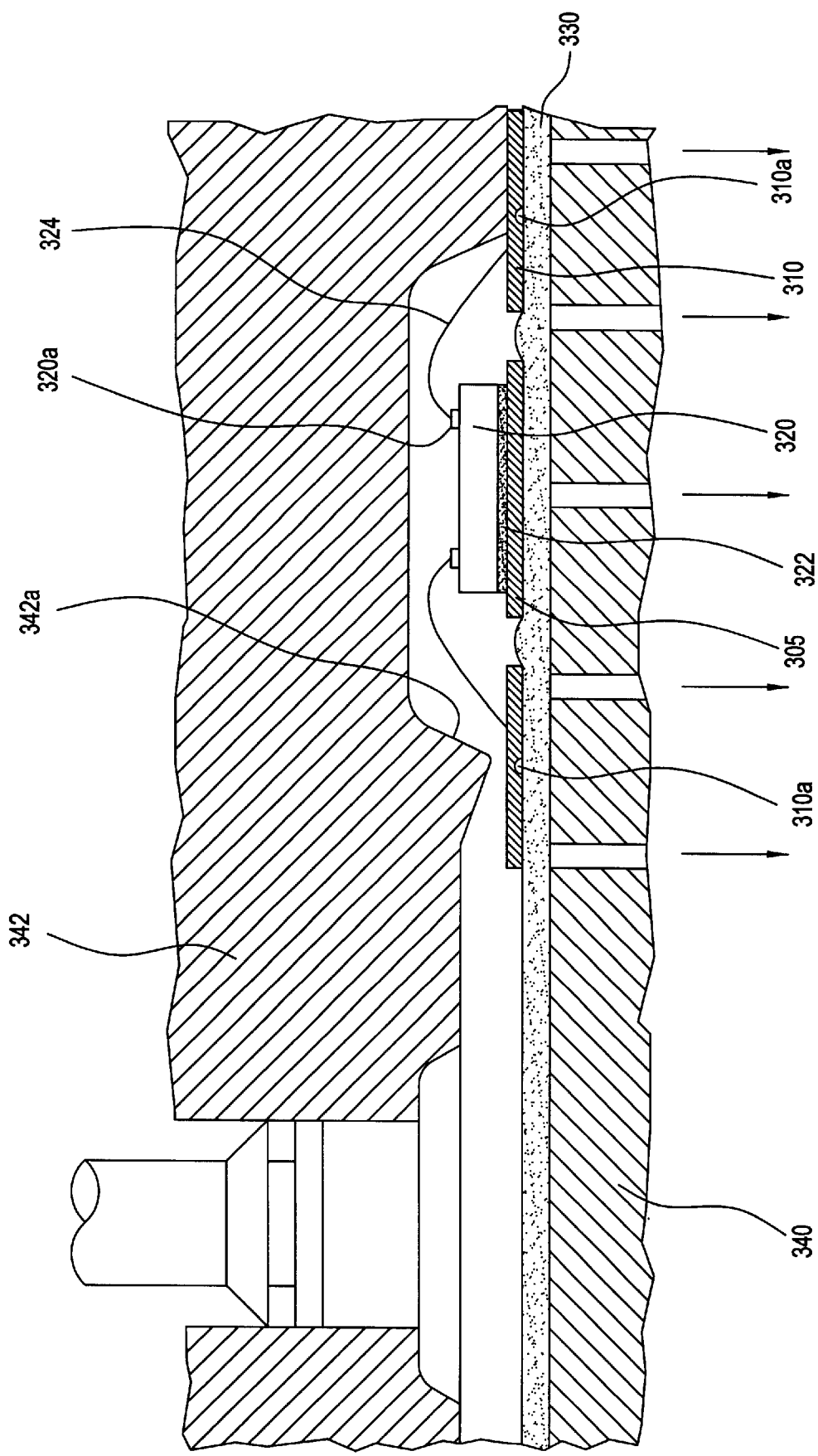

FIGS. 5–7 show a method for producing a leadless semiconductor chip package in accordance with the present invention.

Referring to FIG. 5, a semiconductor die 320 is securely attached onto the die pad 305 of the lead frame by an electrically conductive adhesive such as silver paste 322. The semiconductor die 320 has a plurality of bonding pads 320a formed thereon for electrically interconnecting to the inner circuits thereof. A plurality of bonding wires such as gold wires 324 are connected to the inner ends of the leads 310 and the corresponding bonding pads 320a using known wire bonding techniques.

Referring to FIG. 6, a film 330 is sucked against the lower part 340 of a molding die. The film 330 is fed to cover the surface of the lower part 340 of the molding die and then air is sucked through a plurality of through-holes by an air suction mechanism (not shown) such that the film 330 is fixed on the lower part 340 of the molding die. The upper part 342 of the molding die has a cavity 342a shaped generally to conform to the to-be-molded shape of the leadless semiconductor chip package. Preferably, the film 330 is made of heat-resistant and elastic material such as Teflon (polytetrafluoroethylene, PTFE) or ETFE (ethylene tetrafluoroethylene).

Referring to FIG. 7, the molding die is closed and clamped together in a manner that the semiconductor die 320 is positioned in the cavity and the lead frame is disposed against the film. After that, a hardenable molding compound is transferred into the cavity 342a. When the molding compound hardens, the molding die is unclamped and opened to take out the molded product.

Finally, excess encapsulant formed on the molded product is removed and a singulation process is carried out by punching the molded product along the notches 307a, 310a of the lead frame in order to obtain the finished product in accordance with the present invention.

Referring to FIG. 3 again, compound line 350 indicates the outline of the package body formed on the lead frame. The molded product after degating is cut into separate units along the punching line 360 to obtain the finished product of the semiconductor chip package.

The leadless semiconductor chip package in accordance with the present invention can be mounted onto a substrate, such as a circuit board, like other leadless devices. For example, a PC board is screened printed with a solder paste in a pattern which corresponds to the pattern of the leads exposed from the bottom surface of the chip package. The package is then appropriately positioned on the PC board and the solder is reflowed. It should be understood that the exposed portions of the leads of the package can be printed with solder paste and then mounted onto a substrate.

Figure 4:
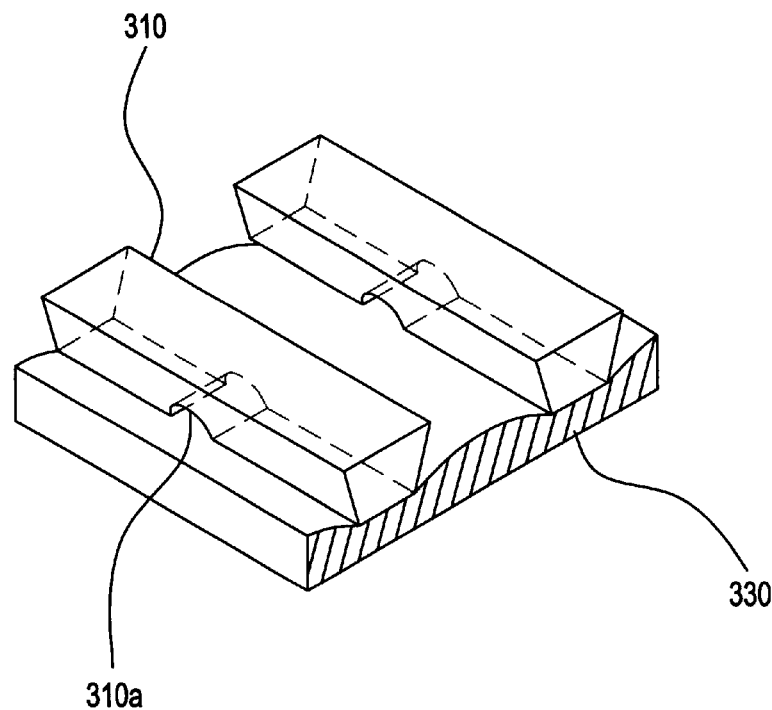
FIG. 4 is a detailed perspective view of the leads of the lead frame of FIG. 3 positioned against a film.

Referring to FIG. 4 and FIG. 7, when the molding die is closed and clamped, the lead frame is pressed and gets sunk into the elastic film 330. That provides better sealing effect to prevent flash from forming on the lower surface of the leadless semiconductor chip package thereby assuring the solder joint reliability thereof. Further, each lead of the lead frame in accordance with the present invention has a tapered profile such that each lead gets sunk into the film 330 more easily. That increases the stand-off of each lead protruding from the bottom of the package wherein the lead protrusion can enhance the solderability.

Since the lead frame in accordance with the present invention has notches formed at the to-be-punched positions thereof, the molded product can be punched along the notches of the lead frame thereby making the singulation process more convenient and correct.

Although the invention has been explained in relation to its preferred embodiment, it is to be understood that many other possible modifications and variations can be made without departing from the spirit and scope of the invention as hereinafter claimed.

What is claimed is:

1. A method for manufacturing a leadless semiconductor chip package comprising the steps of:

providing a lead frame including a die pad and a plurality of leads arranged about the periphery of the die pad, each lead of the lead frame having a notch formed at the to-be-punched position thereof;

attached a semiconductor die to the die pad of the lead frame, the die having a plurality of bonding pads formed thereon;

wire bonding the inner ends of the leads to the bonding pads on the semiconductor die;

providing a molding die including an upper part and a lower part, the upper part of the molding die having a cavity;

providing a film being sucked against the lower part of the molding die;

closing and clamping the molding die in a manner that the semiconductor die is positioned in the cavity and the lead frame is disposed against the film;

transferring a hardenable molding compound into the cavity;

hardening the molding compound;

unclamping and opening the molding die to take out the molded product; and singulating the molded product by punching along a punching line corresponding to the notches of the leads.

2. The method as claimed in claim 1, wherein the film is made of heat-resistant and elastic material.

3. The method as claimed in claim 1, wherein each lead of the lead frame is tapered toward a lower surface thereof.

4. The method as claimed in claim 1, wherein the lead frame includes supporting bars for connecting the die pad, each supporting bar is tapered toward a lower surface thereof, and each supporting bar has a notch formed at the to-be-punched position thereof.

5. The method as claimed in claim 1, wherein the die pad of the lead frame is tapered toward a lower surface thereof.

6. The method as claimed in claim 1, wherein the film is made of one of Teflon and ETFE.

* * * * *